(12) United States Patent
Mishra et al.

(10) Patent No.: US 12,142,337 B2
(45) Date of Patent: *Nov. 12, 2024

(54) SYSTEM AND METHOD FOR PARALLEL MEMORY TEST

(71) Applicant: TEXAS INSTRUMENTS INCORPORATED, Dallas, TX (US)

(72) Inventors: Nitesh Mishra, Kanpur (IN); Nikita Naresh, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,400

(22) Filed: Aug. 22, 2023

(65) Prior Publication Data
US 2023/0402124 A1 Dec. 14, 2023

Related U.S. Application Data

(63) Continuation of application No. 17/538,982, filed on Nov. 30, 2021, now Pat. No. 11,776,656.

(30) Foreign Application Priority Data

Apr. 23, 2021 (IN) .............................. 202141018707

(51) Int. Cl.
*G11C 29/46* (2006.01)
*G11C 29/12* (2006.01)
(Continued)

(52) U.S. Cl.
CPC ........ *G11C 29/46* (2013.01); *G11C 29/12015* (2013.01); *G11C 29/18* (2013.01); *G11C 29/38* (2013.01); *H03K 19/1737* (2013.01)

(58) Field of Classification Search
CPC ... G11C 29/12015; G11C 29/18; G11C 29/38; G11C 29/26; G11C 2029/2602; H03K 19/1737
See application file for complete search history.

(56) References Cited

U.S. PATENT DOCUMENTS 11,449,404 B1 * 9/2022 Ziaja ..................... G11C 29/40
2004/0109381 A1 6/2004 Bachot et al.
(Continued)

*Primary Examiner* — Mohammed A Bashar
(74) *Attorney, Agent, or Firm* — Michael T. Gabrik; Frank D. Cimino

(57) ABSTRACT

A device including a controller coupled to memory components via a forward data path, and a signature register coupled to the memory components via a backward data path. The controller provides memory address signals and a controller clock signal to the memory components via the forward data path, which includes first circuitry to provide test-enable signals to the memory components that enable the memory components to read stored memory values. The backward data path includes second circuitry to receive from the memory components a set of memory signals and combine them into a combined signal. Each memory signal is associated with a respective one of the memory components and includes at least one stored memory value read from the corresponding memory component. The signature register calculates a test signature based on the combined signal and compares the test signature to an expected signature.

19 Claims, 5 Drawing Sheets

(51) Int. Cl.
    *G11C 29/18*    (2006.01)
    *G11C 29/38*    (2006.01)
    *H03K 19/173*   (2006.01)

(56) References Cited

U.S. PATENT DOCUMENTS

| | | | |
|---|---|---|---|
| 2008/0098269 A1* | 4/2008 | Bhavsar | G01R 31/3187 |
| | | | 714/733 |
| 2010/0058128 A1 | 3/2010 | Casarsa | |
| 2019/0041453 A1* | 2/2019 | Shenoy | G11C 29/1201 |
| 2021/0334017 A1* | 10/2021 | Troia | G11C 29/46 |

\* cited by examiner

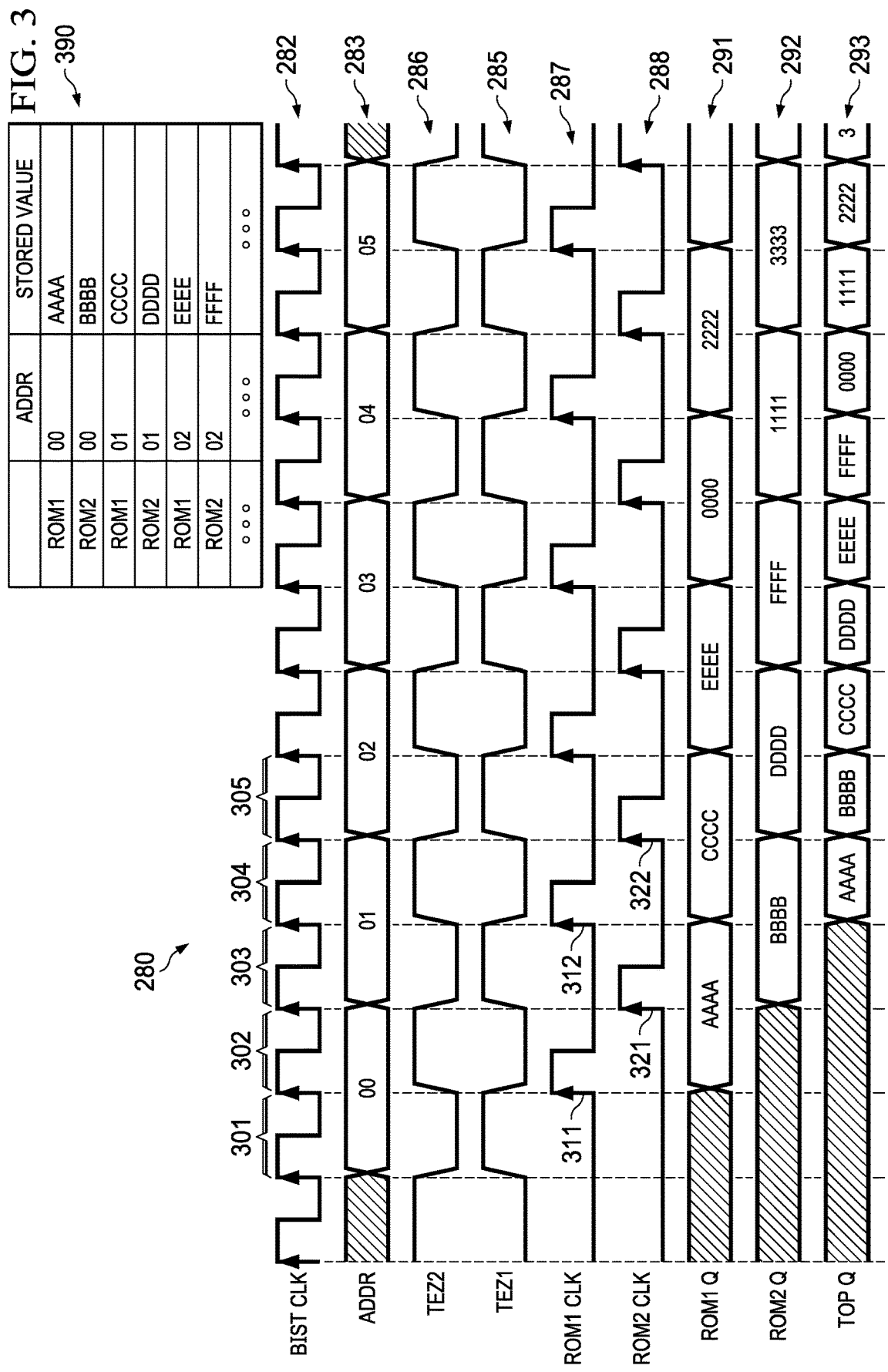

ND METHOD FOR PARALLEL
SYSTEM AND METHOD FOR PARALLEL MEMORY TEST

CROSS-REFERENCE TO RELATED APPLICATIONS

This application claims priority on and the benefit of U.S. application Ser. No. 17/538,982, filed Nov. 30, 2021, which claims the benefit of India Provisional Patent Application No. 202141018707, filed Apr. 23, 2021, each of which is hereby incorporated by reference in its entirety.

BACKGROUND

An embedded system is a combination of a processor, memory and other hardware components that have dedicated functions, such as in a system on a chip (SoC) within a computer or a digital electronic device. Embedded systems are often based on microcontrollers or microprocessors with integrated memory and peripheral interfaces on a chip or an electronic circuit board. In such systems, an embedded memory is a device that stores information for real-time or fast processing in a computer or digital electronic hardware. Modern memory implemented as a semiconductor device can be volatile or non-volatile. Examples of non-volatile memory include flash memory, read-only memory (ROM) and programmable ROM (PROM). Examples of volatile memory include random access memory (RAM), dynamic RAM (DRAM) and fast cache memory. A digital signal can be represented mathematically as one (1) or a zero (0).

SUMMARY

In an example, a device includes a controller coupled to memory components via a forward data path. The controller is configured to provide memory address signals and a controller clock signal to the memory components via the forward data path, which includes first circuitry configured to provide test-enable signals to the memory components that enable the memory components to read, according to the memory address signals and based on the controller clock signal, stored memory values. The device also includes a signature register coupled to the memory components via a backward data path, which includes second circuitry configured to receive from the memory components a set of memory signals, and combine the set of memory signals into a combined signal. Each memory signal of the set of memory signals is associated with a respective one of the memory components and includes at least one stored memory value read from the corresponding memory component. The signature register is configured to calculate a test signature based on the combined signal, and compare the test signature to an expected signature.

In an example, a method includes transferring a first memory address to a first memory component and a second memory component in a first time period of a controller clock signal; transitioning, within the first time period of the controller clock signal, a first test-enable signal for the first memory component from a first signal value to a second signal value and transitioning a second test-enable signal for the second memory component from the second signal value to the first signal value; initiating, within the first time period of the controller clock signal, a first cycle of a first memory component clock signal for the first memory component based on the first test-enable signal; triggering, by the first cycle of the first memory component clock signal, the first memory component to read a first memory value stored at the first memory address in the first memory component; transitioning, at the end of the first time period of the controller clock signal, the first test-enable signal from the first signal value to the second signal value and transitioning the second test-enable signal from the second signal value to the first signal value; initiating, within a second time period of the controller clock signal, a first clock cycle of a second memory component clock signal for the second memory component based on the second test-enable signal transitioning from the second signal value to the first signal value; triggering, by the first clock cycle of the second memory component clock signal, the second memory component to read a second memory value stored at the first memory address of the second memory component; sending the first and second memory values from the first and second memory components, respectively, to a multiplexer; and transferring the first and second memory values serially to combining circuitry.

In an example, a device includes a built-in self-test (BIST) controller coupled to read-only memories (ROMs); a memory data path circuit coupled to the BIST controller and to the ROMs; a control clock coupled to the memory data path circuit; and a BIST data analysis component coupled to the BIST controller, the memory data path circuit and the control clock. The BIST data analysis component is configured to test memory values read from the ROMs.

BRIEF DESCRIPTION OF THE DRAWINGS

For a detailed description of various examples, reference will now be made to the accompanying drawings.

FIG. 3 is a diagram of sequences of signals in the memory test architecture of FIGS. 2A and 2B, in accordance with various examples.

DETAILED DESCRIPTION

Memories in embedded systems are tested to verify their proper operation and to detect possible faults. For example, an embedded memory in an SoC may be tested during manufacturing to detect possible defects. A memory on a chip can also be tested by a BIST controller, for instance at boot-up of a system including the memory or periodically. ROMs are one-time programmable devices in which errors in coding such devices can cause reduced performance and may be non-repairable. Therefore, testing such devices at boot-up or periodically may improve operation of various SoC applications. For example, in automotive systems, reducing testing time during boot-up or during periodic checking of ROM code/content may facilitate proper device operation and satisfy safety requirements. However, the ROMs in some systems may be tested in a serial manner, rather than in parallel, in order to limit the number of required components for testing and limit the size area of a memory test architecture. The serial testing of ROMs in such systems can impose limitations on the achievable memory test time of the system.

The description provides for implementing parallel testing of ROMs in the memory test architecture. The parallel testing of ROMs can reduce the testing time and cost, such as during automatic test equipment (ATE) screening, in comparison to serial testing, which makes such architecture suitable for applications with fast boot-up and periodic testing requirements. For example, a memory enable logic circuit is positioned on a forward data path between the BIST controller and the ROMs. The memory enable logic circuit is configured to send the ROMs respective test-enable signals to distribute the testing of test signals from the BIST controller among the ROMs in a parallel manner. The test signals may include memory address signals indicating memory addresses in the ROMs that include memory values. Parallel testing the test signals among the ROMs can be achieved by clocking the BIST controller at a higher frequency than the ROMs and having each ROM perform a read operation according to portions of the test signals. The ROM read values are then multiplexed into a combined ROM output at the same clock frequency of the BIST controller. The combined ROM output may be used to calculate a test signature for testing the ROMs to detect possible faults. Therefore, the time of testing can be reduced in comparison to serial testing the ROMs. The peak power per clock cycle during testing can also be reduced since the ROMs perform read operations at different clock cycles according to the test-enable signals.

Figure 1:
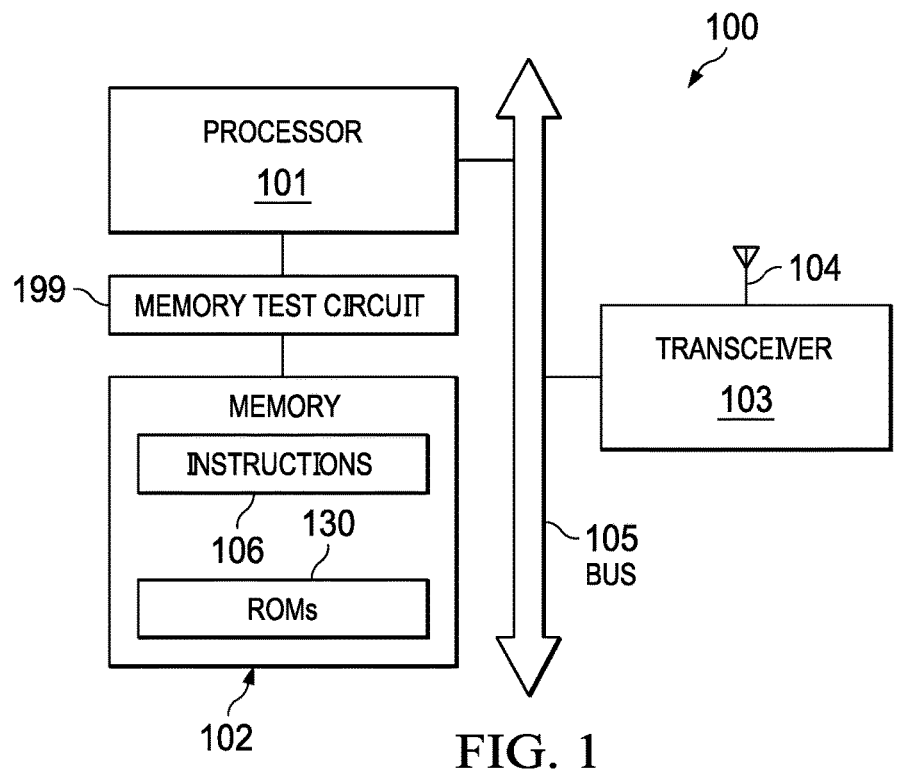
FIG. 1 is a block diagram of a hardware architecture for processing signal data, in accordance with various examples.

FIG. 1 is a block diagram of a hardware architecture 100 of a processing system useful for processing signal data, in accordance with various examples. The hardware architecture 100 includes hardware components that may be part of the processing system. In an example, the hardware architecture 100 may be part of an automotive system that provides signal processing and control. As shown in FIG. 1, the hardware architecture 100 may include one or more processors 101 and one or more memories 102. In some examples, the hardware architecture 100 may also include one or more transceivers 103 and one or more antennas 104 for establishing wireless connections. These components may be connected through a bus 105 or in any other suitable manner. In FIG. 1, an example in which the components are connected through a bus 105 is shown.

The processor 101 may be configured to read and execute computer-readable instructions. For example, the processor 101 may be configured to invoke and execute instructions stored in the memory 102, including the instructions 106. The processor 101 may support one or more global systems for wireless communication. Responsive to the processor 101 sending a message or data, the processor 101 drives or controls the transceiver 103 to perform the sending. The processor 101 also drives or controls the transceiver 103 to perform receiving, responsive to the processor 101 receiving a message or data. Therefore, the processor 101 may be considered as a control center for performing sending or receiving and the transceiver 103 is an executor for performing the sending and receiving operations.

In some examples, the memory 102 may be coupled to the processor 101 through the bus 105 or an input/output port (not shown). In other examples, the memory 102 may be integrated with the processor 101. The memory 102 is configured to store various software programs and/or multiple groups of instructions, including instructions 106. For example, the memory 102 may include a high-speed random-access memory and/or may include a nonvolatile memory such as one or more disk storage devices, a flash memory or another nonvolatile solid-state storage device. The memory 102 may store an operating system such as ANDROID, IOS, WINDOWS or LINUX. The memory 102 may further store a network communications program. The network communications program is useful for communication with one or more attached devices, one or more user equipments or one or more network devices, for example. The memory 102 may further store a user interface program. The user interface program may display content of an application through a graphical interface and receive a control operation performed by a user on the application via an input control such as a menu, a dialog box or a physical input device (not shown). The memory 102 may be configured to store the instructions 106 for implementing the various methods and processes provided in accordance with the various examples of this description.

The antenna 104 may be configured to convert electromagnetic energy into an electromagnetic wave in free space or convert an electromagnetic wave in free space into electromagnetic energy in a transmission line. The transceiver 103 may be configured to transmit a signal that is provided by the processor 101 or may be configured to receive a wireless communications signal received by the antenna 104. In this example, the transceiver 103 may be considered a wireless transceiver.

The hardware architecture 100 may also include another communications component such as a Global Positioning System (GPS) module, a BLUETOOTH module or a WI-FI module. The hardware architecture 100 may also support another wireless communications signal such as a satellite signal or a short-wave signal. The hardware architecture 100 may also be provided with a wired network interface or a local area network (LAN) interface to support wired communication.

In various examples, the hardware architecture 100 may further include an input/output device (not shown) such as an audio input/output device, a key input device, a display and the like. The input/output device may be configured to implement interaction between the hardware architecture 100 and a user/an external environment and may include the audio input/output device, the key input device, the display and the like. The input/output device may further include a camera, a touchscreen, a sensor and the like. The input/output device may communicate with the processor 101 through a user interface.

The hardware architecture 100 shown in FIG. 1 is an example of implementation in various examples of this description. During actual application, the hardware architecture 100 may include more or fewer components. The hardware architecture 100 may also include ROMs 130 coupled to the processor 101. The ROMs 130 may be part of the memory 102 and may be connected to a memory test circuit 199 and the processor 101.

Figure 2A:
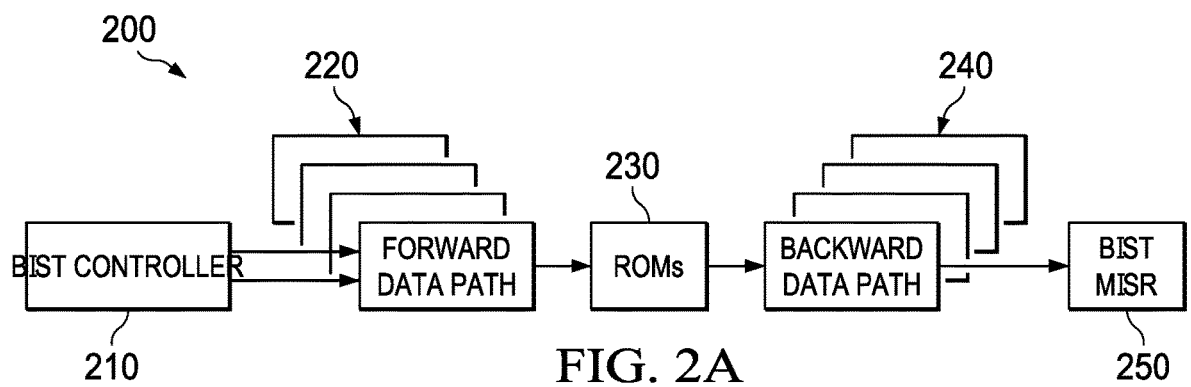
FIG. 2A is a circuit diagram of a memory test architecture, in accordance with various examples.
Figure 2B:
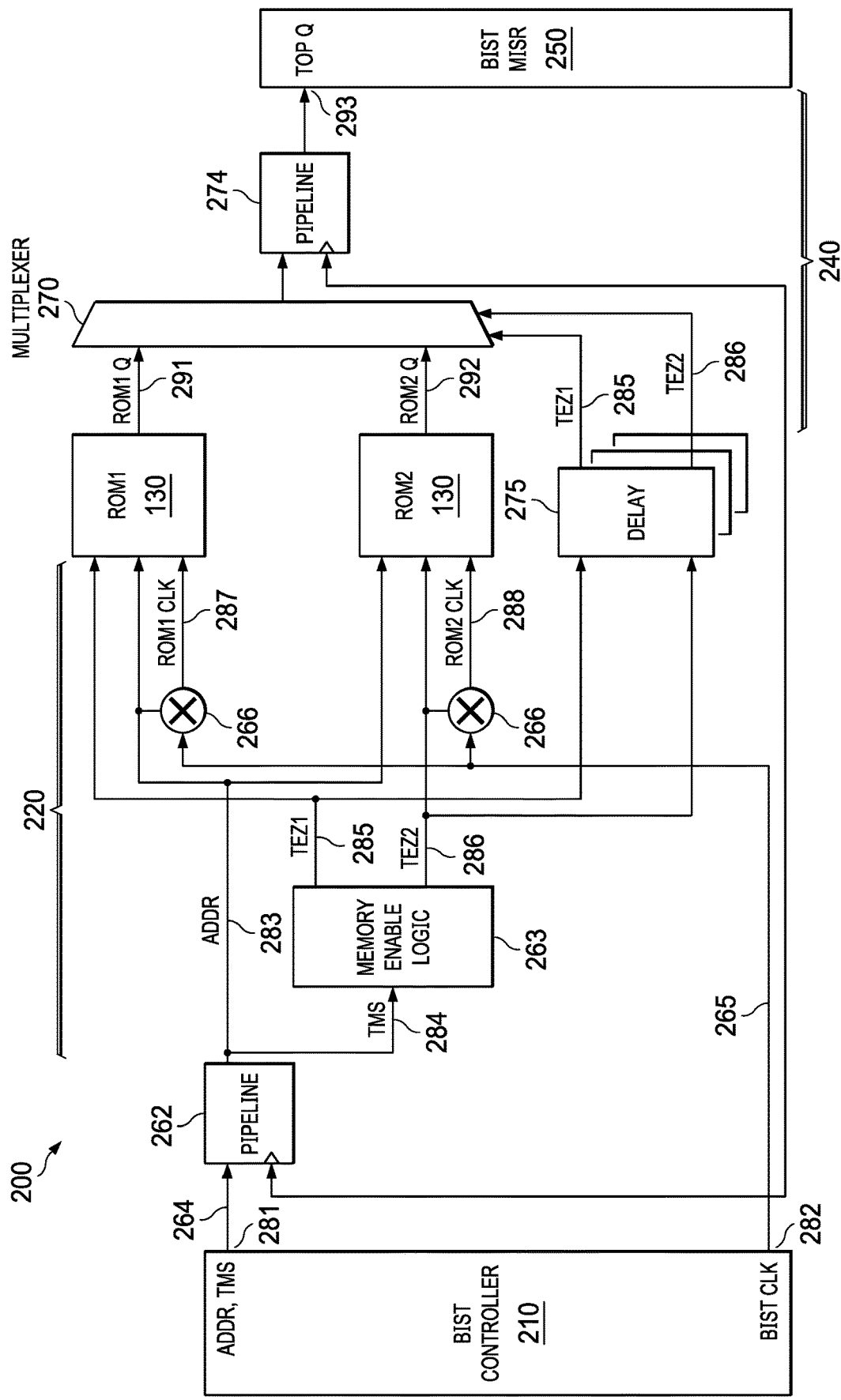
FIG. 2B is a circuit diagram showing components of the memory test architecture of FIG. 2A, in accordance with various examples.

FIGS. 2A and 2B show block diagrams of the memory test architecture 200 of the memory test circuit 199, in accordance with various examples. For example, the memory test architecture 200 may be a component of the hardware architecture 100, the memory 102 or may be integrated with the processor 101. The memory test architecture 200 may include a BIST controller 210 coupled through a forward data path 220 to multiple ROMs 130. The memory test architecture 200 may also include a backward data path 240 coupled to the ROMs 130 and to a BIST MISR 250. The forward data path 220 and the backward data path 240 may be a collection of functional units, registers and buses. In various examples, the functional units may be arithmetic logic units, multipliers or other suitable logical circuits that perform data processing operations.

The ROMs 130 are coupled in a parallel arrangement to the BIST controller 210 via parallel paths of the forward data path 220. The forward data path 220 may include one or more first pipelines 262 and a memory enable logic circuit 263. The one or more first pipelines 262 may be coupled via a data and control channel 264 and a clock channel 265 to the BIST controller 210 and may include a last forward pipeline coupled via parallel paths of the forward data path 220 to the ROMs 130. In other examples, the one or more first pipelines 262 may be coupled via the clock channel 265 to a clock (not shown) outside the BIST controller 210. The memory enable logic circuit 263 is coupled to the one or more first pipelines 262 and is coupled via parallel paths of the forward data path 220 to the ROMs 130. The ROMs 130 are coupled to the BIST MISR 250 via parallel paths of the backward data path 240. The backward data path 240 may include a multiplexer 270 and one or more second pipelines 274. The multiplexer 270 is coupled via the parallel paths of the backward data path 240 to the ROMs 130 and via a first backward pipeline of the one or more second pipelines 274 to the BIST MISR 250. The one or more second pipelines 274 are also coupled to the clock channel 265. The one or more first pipelines 262 and the one or more second pipelines 274 may include one or more elements (not shown) including a buffer, a register, a signal processing element or any combination thereof. The memory test architecture 200 may also include delay elements 275 configured to delay signals for a preset amount of time, which may depend on the number of the number of ROMs 130 to be tested. As shown in FIG. 2B, each parallel path between the memory enable logic circuit 263 and a respective ROM 130 may also be coupled to the delay elements 275. The delay elements 275 are also coupled to the multiplexer 270.

The memory test architecture 200 may include a positive integer number M of ROMs 130 in the memory test architecture 200. FIG. 2 shows one of the examples in which the number M of ROMs 130 in the memory test architecture 200 is equal to two, and the ROMs 130 include a first ROM 130 (ROM1) and a second ROM 130 (ROM2). However, in other examples, M may be any other suitable positive integer value.

The components of the memory test architecture 200 may exchange multiple signals to enable the parallel testing of the ROMs 130 by the BIST controller 210. The signals include memory address and control signals 281 and a BIST controller clock signal (BIST CLK) 282. The memory address and control signals 281 may be sent on the data and control channel 264 from the BIST controller 210 to the one or more first pipelines 262. Each one of the ROMs 130 may receive from the one or more first pipelines 262 memory address signals 283 indicating memory addresses (ADDR) in the memory address and control signals 281. The memory address signals 283 may be sent from the first pipeline 262 to the ROMs 130 according to the BIST controller clock signal 282. The BIST controller clock signal 282 may also be sent on the clock channel 265 to the ROMs 130. The ROMs 130 may be coupled to the clock channel 265 via respective clock gates 266.

The memory enable logic circuit 263 may receive from the one or more pipelines 262 a test memory select signal 284 (TMS) in the memory address and control signals 281. The memory enable logic circuit 263 may be configured, based on the TMS signal 284, to send to the ROMs 130 respective test-enable signals that enable the ROMs 130 to read stored values during respective clock cycles of the BIST controller clock signal 282. The ROMs 130 may read the stored values based on the memory addresses indicated in the memory address signals 283. Each ROM 130 is enabled to read the stored values at the clock cycles of the BIST controller clock signal 282 if the respective test-enable signal transitions from a high signal value to a low signal value. The test-enable signals may be sent by the memory enable logic circuit 263 to cause the different ROMs 130 to read stored values at different cycles of the BIST controller clock signal 282. For example, the memory enable logic circuit 263 may send a first test-enable active low signal 285 (TEZ1) to the first ROM 130 and a second test-enable active low signal 286 (TEZ2) to the second ROM 130, which cause the two ROMs 130 to read respective stored values at different and alternating clock cycles of the BIST controller clock signal 282. The first test-enable active low signal 285 may cause a first clock gate 266 coupled to the first ROM 130 to provide a first ROM clock signal 287 by sampling clock cycles from the BIST controller clock signal 282. The clock cycles of the first ROM 130 are provided by sampling clock cycles from the BIST controller clock signal 282 according to the clock cycles of the first test-enable active low signal 285. Similarly, the second test-enable active low signal 286 may cause a second clock gate 266 coupled to the second ROM 130 to provide a second ROM clock signal 288 by sampling clock cycles from the BIST controller clock signal 282.

The values read by the ROMs 130 may be sent in respective ROM signals on respective paths to the multiplexer 270. For example, the first ROM 130 and second ROM 130 my send a first ROM signal 291 and a second ROM signal 292, respectively, to the multiplexer 270. The test-enable signals sent to the ROMs 130 may also be sent to the delay elements 275. The delay elements 275 may retain the test-enable signals for a certain delay time before forwarding the delayed test-enable signals to the multiplexer 270. The delay time provided by the delay elements 275 to the test-enable signals may match a delay time for forwarding the respective ROM signals from the ROMs 130 to the multiplexer 270. Accordingly, the multiplexer 270 may receive the values read by the ROMs 130 and the respective test-enable signals at the same clock cycles. The multiplexer 270 may send the read values in the ROM signals according to the respective delayed test-enable signals. For example, each received value in the ROM signals is sent to the second pipelines 274 if the respective delayed test-enable signal transitions from a high signal value to a low signal value. The second pipelines 274 may receive the read values and combine the values in respective clock cycles of the BIST controller clock signal 282 into a combined ROM signal 293. The second pipelines 274 may forward the read values as part of the combined ROM signal 293 to the BIST MISR 250. The BIST MISR 250 may calculate a test signature based on the combined ROM signal 293.

FIG. 3 is a diagram of sequences of signals 300 in the memory test architecture 200, in accordance with various examples. The sequences of signals 300 include signal sequences in time of the BIST controller clock signal 282 (BIST CLK), the memory address signals 283 that indicate the memory addresses (ADDR) in the ROMs 130, the first test-enable active low signal 285 (TEZ1) for the first ROM 130, the second test-enable active low signal 286 (TEZ2) for the second ROM 130, the first ROM clock signal 287 (ROM1 CLK) for the first ROM 130, the second ROM clock signal 288 (ROM2 CLK) for the second ROM 130, the first ROM signal 291 (ROM1 Q) from the first ROM 130, the second ROM signal 292 (ROM2 Q) from the second ROM 130 and the combined ROM signal 293 (TOP Q).

The memory address signals 283 may be arranged in a sequence of equal clock cycles of the BIST controller clock signal 282. Each memory address signal 283 may have a time length of a single clock cycle or integer multiples of clock cycles of the BIST controller clock signal 282. For example, as shown in FIG. 3, each memory address signal 283 may have a time length of two clock cycles of the BIST controller clock signal 282. Each memory address signal 283 may indicate a memory address in the ROMs 130, which may store a value. The value is stored in the ROMs 130 at the memory address indicated in the memory address signal 283. The memory address signals 283 instruct the ROMs 130 to read the stored values in the ROMs 130 at the memory addresses indicated in the memory address signals 283.

The memory address signals 283 may be distributed in parallel among the ROMs 130 by providing the ROMs 130 with respective ROM clock signals. The ROM clock signals may be provided to the respective ROMs 130 by clocking, via the respective clack gates 266, the BIST controller clock signal 282 according to the respective test-enable signals from the memory enable logic circuit 263. The clock cycles of the BIST controller clock signal 282 may be clocked at a higher frequency than the ROM clock signals. Therefore, the clock cycles of the ROM clock signals may have longer clock cycles than the BIST controller clock signal 282. For example, the clock cycles of the ROM clock signals for a number M ROMs 130 may be clocked at a frequency of N/M hertz, where N is the frequency of the clock cycles of the BIST controller clock signal 282. The ROM clock signals of the respective ROMs 130 may also include time lags with respect to each other. For example, a first clock gate 266 may provide the first ROM clock signal 287 to the first ROM 130 by clocking the BIST controller clock signal 282 based on the first test-enable active low signal 285. A second clock gate 266 may provide the second ROM clock signal 288 to the second ROM 130 by clocking the BIST controller clock signal 282 based on the second test-enable active low signal 286. The clock cycles of the first ROM clock signal 287 and similarly the clock cycles of the second ROM clock signal 288 may be equal to about twice the clock cycles of the BIST controller clock signal 282. The second ROM clock signal 288 may lag the first ROM clock signal 287 by one clock cycle of the BIST controller clock signal 282.

By clocking the ROM clock signals of the ROMs 130 based on the test-enable signals, the sequence of clock cycles of the ROM clock signals matches the sequence of clock cycles of the respective test-enable signals. For example, as shown in FIG. 3, the sequence of clock cycles of the first ROM clock signal 287 may overlap or match with the sequence of equal clock cycles of the first test-enable signal 285. Similarly, the sequence of clock cycles of the second ROM clock signal 288 may overlap or match with the sequence of equal clock cycles of the second test-enable signal 286. The second test-enable signal 286 may also lag the first test-enable signal 285 by one clock cycle of the BIST controller clock signal 282.

As described above, the test-enable signals may trigger the ROMs 130 to read locally stored values. A ROM 130 may be enabled to read the stored value if the signal level of the respective test-enable signal of the ROM 130 satisfies a threshold. In various examples, the ROMs 130 may be enabled to read the respective stored values if the signal level of the respective test-enable signals transitions from a higher signal level to a lower signal level. In other examples, the ROMs 130 may be enabled to read the respective stored values if the signal level of the respective test-enable signals transitions from a lower signal level to a higher signal level.

Each ROM 130 may read the locally stored values according to the memory address values in the memory address signals 283. The resulting read values from the ROMs 130 may be provided in respective ROM signals, such as the first ROM signal 291 from the first ROM 130 and the second ROM signal 292 from the second ROM 130. The sequence of read values in the ROM signals may overlap or match with the clock cycles of the respective ROM clock signals. The ROM clock signals and similarly the respective ROM signals may include time lags with respect to each other. For example, the second ROM clock signal 288 may lag the first ROM clock signal 287 by one clock cycle of the BIST controller clock signal 282. Similarly, the second ROM signal 292 may lag the first ROM signal 291 by one clock cycle of the BIST controller clock signal 282.

According to the example shown in FIG. 3, the first and second ROMs 130 receive, from the first pipelines 262, a first address value of 00 in the memory address signals 283 at a first clock cycle 301 of the BIST controller clock signal 282. At the end of the first clock cycle 301, the first test-enable active low signal 285 (TEZ1), which is sent from the memory enable logic 263 to the first ROM 130, transitions from a high signal value to a low signal value. The second test-enable active low signal 286 (TEZ2), which is sent from the memory enable logic 263 to the second ROM 130, transitions from a low signal value to a high signal value. At a second clock cycle 302 of the BIST controller clock signal 282, the first and second ROMs 130 continue receiving the first address value of 00 in the memory address signals 283. The first clock gate 266 of the first ROM 130 clocks, based on the transition of TEZ1, a first clock cycle 311 of the first ROM clock 287, which triggers the first ROM 130 to read the locally stored value AAAA at the memory address 00, as shown in the ROM image table 390 of the ROMs 130. At the end of the second clock cycle 302, TEZ2 transitions from the high signal value to the low signal value and TEZ1 transitions from the low signal value to the high signal value.

At a third clock cycle 303 of the BIST controller clock signal 282, the second clock gate 266 of the second ROM 130 clocks, based on the transition of TEZ2, a first clock cycle 321 of the second ROM clock 288. The first clock cycle 321 triggers the second ROM 130 to read the locally stored value BBBB at the memory address 00, as shown in the ROM image table 390. In the third clock cycle 303, the first and second ROMs 130 receive, from the first pipelines 262, a second address value of 01 in the memory address signals 283. At the end of the third clock cycle 303, the first ROM 130 completes reading the locally stored value AAAA at the memory address 00 and sends the value to the multiplexer 270. The multiplexer 270 also receives from the delay elements 275 a delayed TEZ1 which triggered the first ROM 130 to read the locally stored value AAAA. The multiplexer 270 is triggered based on the delayed TEZ1 to send the read value AAAA to the second pipeline 274. At the end of the third clock cycle 303, TEZ1 transitions from the high signal value to the low signal value and TEZ2 transitions from the low signal value to the high signal value.

At a fourth clock cycle 304 of the BIST controller clock signal 282, the first and second ROMs 130 continue receiving the second address value of 01 in the memory address signals 283. The first clock gate 266 of the first ROM 130 clocks, based on the transition of TEZ1, a second clock cycle 312 of the first ROM clock 287, which triggers the first ROM 130 to read the locally stored value CCCC at the memory address 01, as shown in the ROM image table 390 of the ROMs 130. At the fourth clock cycle 304, the second pipeline 274 provides to the BIST MISR 250 the read value AAAA that was received from the multiplexer 270. At the end of the fourth clock cycle 304, the second ROM 130 also completes reading the locally stored value BBBB at the memory address 01 and sends the value to the multiplexer 270. The multiplexer 270 also receives from the delay elements 275 a delayed TEZ2 which triggered the second ROM 130 to read the locally stored value BBBB. The multiplexer 270 is triggered based on the delayed TEZ2 to send the read value BBBB to the second pipeline 274. At the end of the fourth clock cycle 304, TEZ2 transitions from the high signal value to the low signal value and TEZ1 transitions from the low signal value to the high signal value.

At a fifth clock cycle 305 of the BIST controller clock signal 282, the second clock gate 266 of the second ROM 130 also clocks, based on the transition of TEZ2, a second clock cycle 322 of the second ROM clock 288. The second clock cycle 322 triggers the second ROM 130 to read the locally stored value DDDD at the memory address 01, as shown in the ROM image table 390. At the fifth clock cycle 305, the first and second ROMs 130 receive, from the first pipelines 262, a third address value of 02 in the memory address signals 283. In the fifth clock cycle 305, the second pipeline 274 provides to the BIST MISR 250 the read value BBBB from the first ROM 130. At the end of the fifth clock cycle 305, the first ROM 130 completes reading the locally stored value CCCC at the memory address 01 and sends the value to the multiplexer 270. The multiplexer 270 also receives from the delay elements 275 a delayed TEZ1 which triggered the first ROM 130 to read the locally stored value CCCC. The multiplexer 270 is triggered based on the delayed TEZ1 to send the read value CCCC to the second pipeline 274. At the end of the fifth clock cycle 305, TEZ1 transitions from the high signal value to the low signal value and TEZ2 transitions from the low signal value to the high signal value. The steps above may be repeated at the subsequent clock cycles of the BIST controller clock signal 282 to continue reading the locally stored values in the ROMs 130 according to the address values in the memory address signals 283 and providing the read values, as part of the combined ROM signal 293, to the BIST MISR 250.

Figure 4:
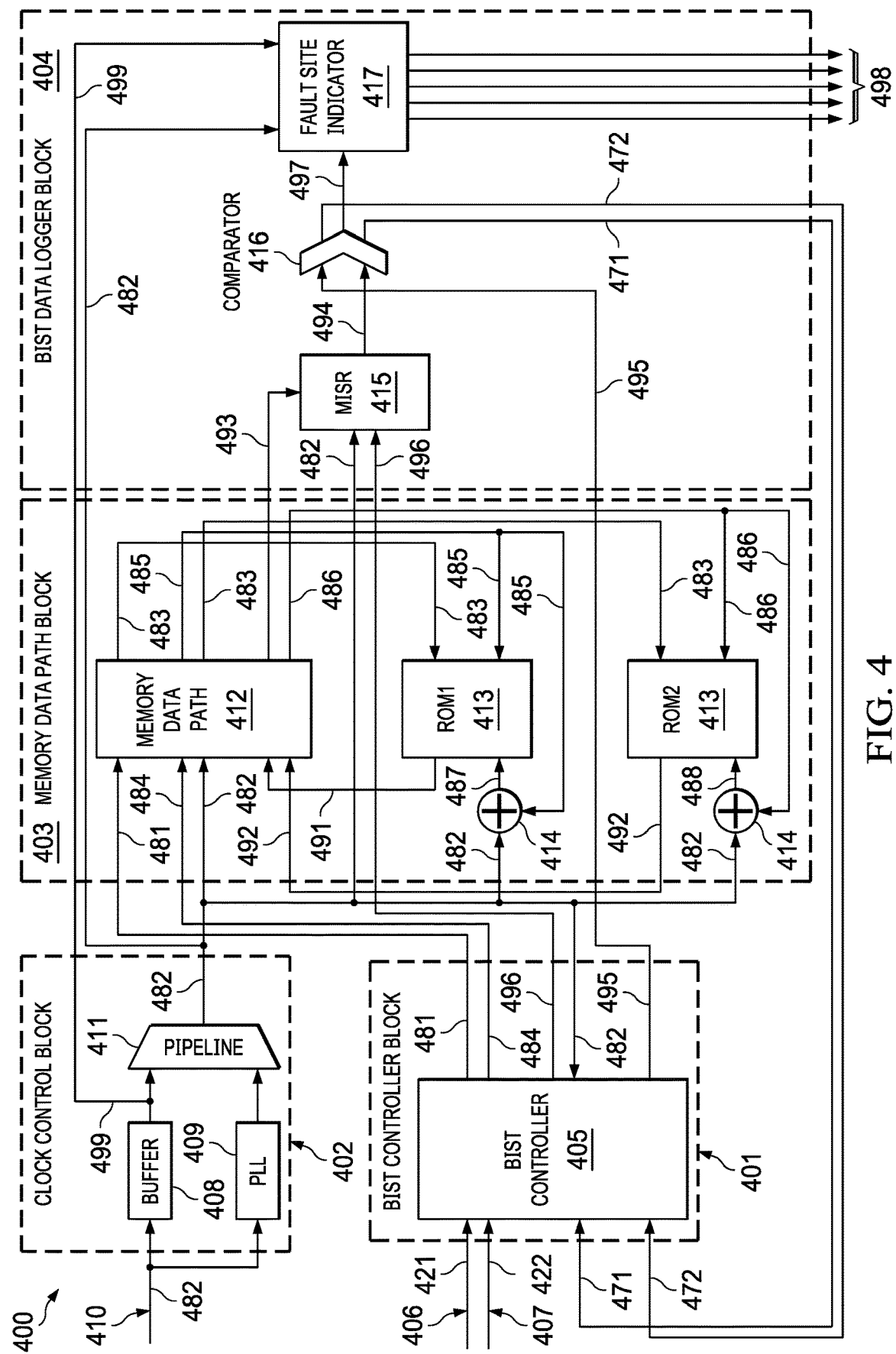
FIG. 4 is a circuit diagram of a memory test architecture, in accordance with various examples.

FIG. 4 is a circuit diagram of a memory test architecture 400, in accordance with various examples. For example, the memory test architecture 400 may be an alternative memory test architecture or component to the memory test architecture 200 in the hardware architecture 100. The memory test architecture 400 may be a component of the memory 102 or may be integrated with the processor 101. The memory test architecture 400 may be an SoC and may include a BIST controller block 401, a clock control block 402, a memory data path block 403 coupled to the BIST controller block 401 and the clock control block 402, and a BIST data logger block 404 coupled to the clock control block 402 and the BIST controller 401. The BIST controller block 401 may include a BIST controller 405 coupled to the memory data path block 403 and the BIST data logger block 404.

The BIST controller 405 may receive via a first channel 406 a BIST reset signal 421 and via a second channel 407 a BIST start signal 422. The BIST reset signal 421 may trigger the BIST controller 405 to reset memory testing in the memory test architecture 400, such as by resetting the signals and registers of the memory test architecture 400. The BIST start signal 422 may trigger the BIST controller 405 to start a new memory testing process in the memory test architecture 400. The clock control block 402 may include a buffer 408 and a phase locked loop (PLL) 409, both coupled to a clock channel 410 and a pipeline 411. The buffer 408 and the PLL 409 may receive a clock signal 482 via the clock channel 410. The buffer 408 may be configured to store and delay the clock signal 482 for a certain delay time. The PLL 409 may be configured to synchronize a local clock of the memory test architecture 400 with the clock signal 482. The clock signal 482 may be forwarded through the pipeline 411 to the memory data path block 403, the BIST controller block 401 and the BIST data logger block 404. The memory data path block 403 may include a memory data path circuit 412, multiple ROMs 413 coupled to the memory data path circuit 412, and multiple clock gates 414 coupled to the respective ROMs 413 and to the clock control block 402. The BIST data logger block 404 may include an MISR 415 coupled to the memory data path circuit 412 and the BIST controller 405, a comparator 416 coupled to the MISR 415 and the BIST controller 405, and a fault site indicator 417 coupled to the comparator 416 and the buffer 408. FIG. 4 shows an example where the number of ROMs 413, M, in the memory test architecture 400 is equal to two. In other examples, M may be any positive integer number.

The components of the memory test architecture 400 may exchange multiple signals to enable the parallel testing of the ROMs 413 by the BIST controller 405. The BIST controller 405 may send a memory address signal 481 to the memory data path circuit 412. The memory data path circuit 412 may forward to the ROMs 413 test signals 483 indicating memory addresses from the memory address signal 481. The test signals 483 may be sent from the memory data path circuit 412 to the ROMs 413 in clock cycles according to the clock signal 482. Both the BIST controller 405 and the memory data path circuit 412 may receive the clock signal 482 from the pipeline 411 in the clock control block 402. The clock signal 482 may also be sent from the pipeline 411 to respective clock gates 414 of the ROMs 413. The BIST controller 405 may also send memory enable signals 484 to the memory data path circuit 412 to control the clock cycles for testing the ROMs 413. The memory data path circuit 412 may forward to the ROMs 413 respective test-enable signals based on the memory enable signals 484. The test-enable signals may have longer clock cycles than the clock signal 482. The test-enable signals of the respective ROMs 413 may also include time lags with respect to each other. In the example shown in FIG. 4 with two ROMs 413 in the memory test architecture 400, the memory data path circuit 412 may send a first test-enable signal 485 to a first ROM 413 and a second test-enable signal 486 to a second ROM 413.

The test-enable signals 485 and 486 enable the first and second ROMS 413 to read locally stored values during different clock cycles of the clock signal 482. The first and second ROMs 413 may read the stored values according to the memory addresses indicated in the test signals 483. The first test-enable signal 485 may cause a first clock gate 414 coupled to the first ROM 413 to sample first clock cycles from the clock signal 482 and accordingly provide a first ROM clock signal 487. Similarly, the second test-enable signal 486 may cause a second clock gate 414 coupled to the second ROM 413 to sample second clock cycles from the clock signal 482 and accordingly provide a second ROM clock signal 488. In examples, the first test-enable signal 485 and the second test-enable signal 486 may be test-enable active low signals (TEZ).

The values read by the ROMs 413 may be sent in respective ROM signals to the memory data path circuit 412. For example, the first ROM 413 and second ROM 413 my send a first ROM signal 491 and a second ROM signal 492, respectively, to the memory data path circuit 412. The memory data path circuit 412 may combine the first ROM signal 491 and second ROM signal 492 into a combined ROM signal 493 and forward the combined ROM signal 493 to the MISR 415. The MISR 415 may calculate a test signature 494 based on the combined ROM signal 493 and the clock cycles of the clock signal 482. The MISR 415 may be enabled to perform the signature calculation according to a MISR enable signal 496 from the BIST controller 405. The MISR 415 may forward the test signature 494 to the comparator 416. The comparator 416 may compare the test signature 494 with an expected signature 495 received from the BIST controller 405. The expected signature 495 may be calculated by the BIST controller 405 based on the memory address signal 481. The comparator 416 may provide a test result signal 497 from comparing the test signature 494 and the expected signature 495 and send the test result signal 497 to the fault site indicator 417. The comparator may also send a fail signal 471 and a BIST done signal 472 to the BIST controller 405. The fail signal 471 may indicate whether a fault has been detected due to a mismatch between the test signature 494 and the expected signature 495. The BIST done signal 472 may indicate end of the testing process of the ROMs 413. The fault site indicator 417 may be configured to log the test result 497 and related test data and signals into test log data 498, which may be stored in the memory test architecture 400. The fault site indicator 417 may obtain the log data 498 based on the test result 497, the clock signal 482 and a respective delayed clock signal 499 from the buffer 408.

In comparison to serial ROM testing, the parallel testing of the ROMs can reduce the amount and area of instructions for testing the ROMs 413. The instructions may be stored in a BIST ROM of the memory data path circuit 412 to perform the various method steps and processes provided in accordance with the various examples of this description. For example, the memory data path circuit 412 may include one common algorithm group of instructions and one memory group of instructions for all the ROMs 413 to be tested.

Figure 5:
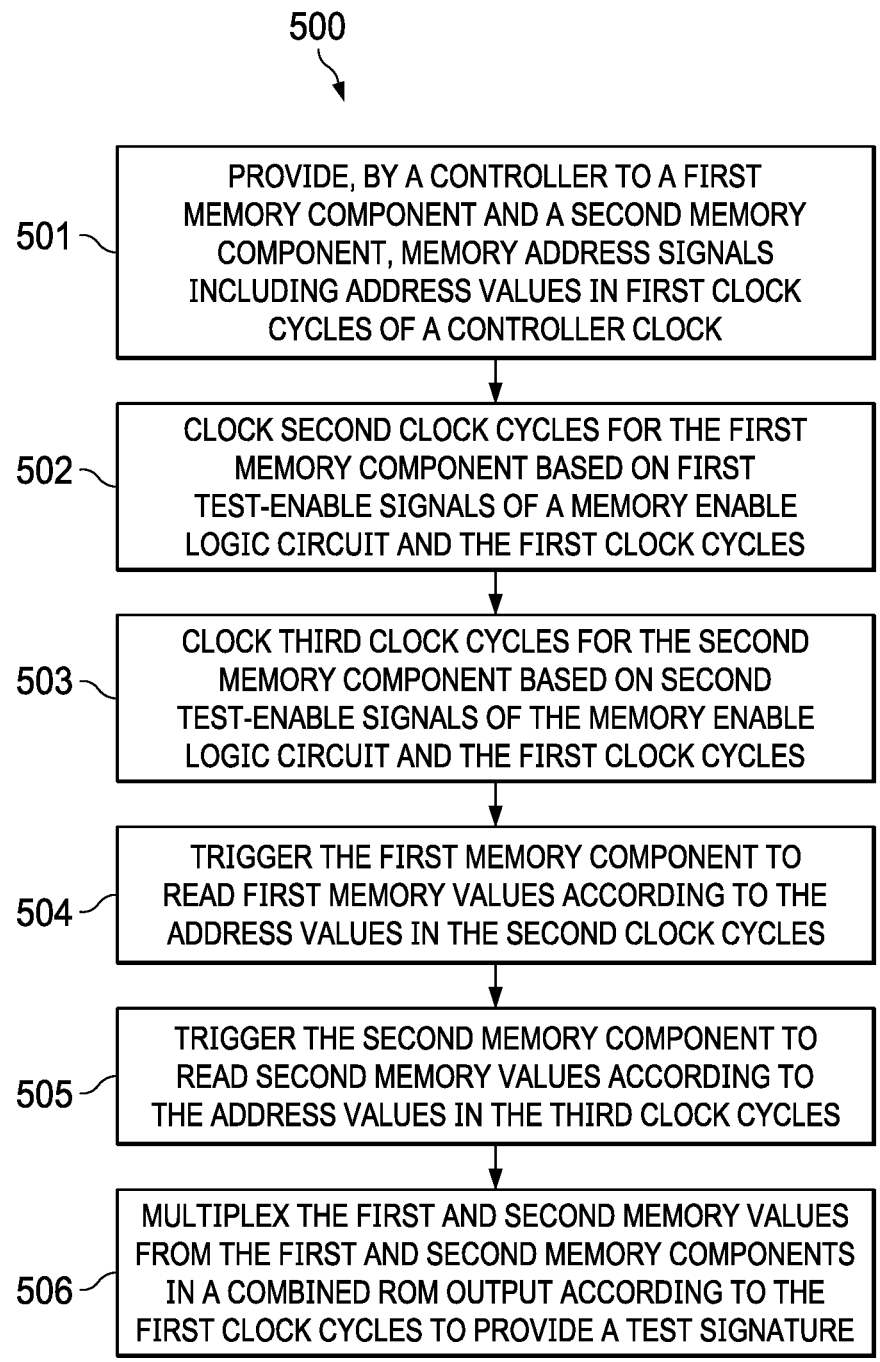
FIG. 5 is a flow diagram of a method for memory testing in a memory test architecture, in accordance with various examples.

FIG. 5 is a flow diagram of a method 500 for memory testing in a memory test architecture, in accordance with various examples. For example, the method 500 may be performed in the memory test architecture 200 or 400 of FIGS. 2 and 4, respectively, reference to which, as well as the signals 300 of FIG. 3, may be made in describing the method 500. At step 501, memory address signals including address values may be provided, by a controller to a first memory component and a second memory component, in first clock cycles of a controller clock. The same memory address signals may be provided from the controller in parallel to the memory components in a first sequence of equal first clock cycles. For example, the ROMs 130 may receive, from the BIST controller 210 on parallel paths in the forward data path 220, the memory address signals 283 at clock cycles of the BIST controller clock signal 301.

At step 502, second clock cycles may be clocked for the first memory component based on first test-enable signals of a memory enable logic circuit and the first clock cycles. The second clock cycles may have longer cycle times than the first clock cycles. At step 503, third clock cycles may be clocked for the second memory component based on second test-enable signals of the memory enable logic circuit and the first clock cycles. The second and third clock cycles may have equal cycle times and the third clock cycles may lag the second clock cycles by a certain clock cycle. For example, the first ROM clock signal 287 of the first ROM 130 may be clocked by a first clock gates 266 based on the first test-enable active low signal 285 from the memory enable logic circuit 263 and the BIST controller clock signal 282 from the BIST controller 210. The second ROM clock signal 288 of the second ROM 130 may be clocked by a second clock gates 266 based on the second test-enable active low signal 286 from the memory enable logic circuit 263 and the BIST controller clock signal 282 from the BIST controller 210. The clock cycles of the first ROM clock signal 287 and the clock cycles of the second ROM clock signal 288 may be equal to about twice the clock cycles of the BIST controller clock signal 282. The second ROM clock signal 288 may lag the first ROM clock signal 287 by one clock cycle of the BIST controller clock signal 282.

At step 504, the first memory component may be triggered to read first memory values according to the address values in the second clock cycles. At step 505, the second memory component may be triggered to read second memory values according to the address values in the third clock cycles. For example, the clock cycles of the first ROM clock signal 287 may trigger the first ROM 130 to read the locally stored values as indicated by the address values in the memory address signals 283. The clock cycles of the second ROM clock signal 288 may trigger the second ROM 130 to read the locally stored values as indicated by the address values in the memory address signals 283. At step 506, the first and second memory values from the first and second memory components are multiplexed in a combined ROM output according to the first clock cycles to provide a test signature. The steps 502 to 505 may be repeated for each memory component in the memory test architecture, such as each ROM 130 in the memory test architecture 200. For example, the first ROM 130 and the second ROM 130 may send the locally read values in the first ROM signal 291 and second ROM signal 292, respectively, to the multiplexer 270. The multiplexer 270 may multiplex the first ROM signal 291 and second ROM signal 292, and any additional ROM signals that may be received from additional ROMs 130, and send the multiplexed ROM signals to the second pipeline 274. The second pipeline 274 may combine the multiplexed ROM signals into the combined ROM signal 293, which may be clocked at the same frequency of the BIST controller clock signal 282. The combined ROM signal 293 may be sent to the BIST MISR 250 to provide a test signature.

While the above examples refer to ROM devices, ROM is only one type of suitable memory that may be used in conjunction with the present technique. The principles herein apply equally to any type of memory and further examples incorporate other alternative types of programmable memory (e.g., RAM, write-once-ready-many memory, solid-state memory, fuses, etc.) and/or hardcoded values.

The term "couple" appears throughout the specification. The term may cover connections, communications or signal paths that enable a functional relationship consistent with this description. For example, if device A provides a signal to control device B to perform an action, in a first example device A is coupled to device B or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device or a combination thereof.

A circuit or device that is described herein as including certain components may instead be adapted to be coupled to those components to form the described circuitry or device. For example, a structure described as including one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement.

description Unless otherwise stated, "about," "approximately," or "substantially" preceding a value means+/−10 percent of the stated value. Modifications are possible in the described examples, and other examples are possible within the scope of the claims.

What is claimed is:

1. A device, comprising:
   a controller coupled to memory components via a forward data path, the controller configured to provide memory address signals and a controller clock signal to the memory components via the forward data path, the forward data path including first circuitry configured to provide test-enable signals to the memory components that enable the memory components to read, according to the memory address signals and based on the controller clock signal, stored memory values; and
   a signature register coupled to the memory components via a backward data path, the backward data path including second circuitry configured to receive from the memory components a set of memory signals, and combine the set of memory signals into a combined signal, each memory signal of the set of memory signals associated with a respective one of the memory components and including at least one stored memory value read from the corresponding memory component, the signature register configured to calculate a test signature based on the combined signal, and compare the test signature to an expected signature.

2. The device of claim 1, wherein the first circuitry includes a first pipeline through which the memory address signals are provided to the memory components.

3. The device of claim 2, wherein the first circuitry includes memory enable logic configured to receive a test memory select signal from the first pipeline and provide the test-enable signals to the memory components based on the test memory select signal.

4. The device of claim 3, wherein the first circuitry includes clock gates configured to receive the controller clock signal and generate respective memory component clock signals.

5. The device of claim 1, wherein the second circuitry includes a multiplexer configured to receive the set of memory signals and delayed test-enable signals, and to sequentially output the set of memory signals in response to sequential receipt of the delayed test-enable signals.

6. The device of claim 5, wherein the second circuitry includes a second pipeline configured to receive the set of memory signals and combine the set of memory signals into the combined signal.

7. The device of claim 1, wherein the memory components include read-only memories.

8. A method, comprising:
   transferring a first memory address to a first memory component and a second memory component in a first time period of a controller clock signal;
   transitioning, within the first time period of the controller clock signal, a first test-enable signal for the first memory component from a first signal value to a second signal value and transitioning a second test-enable signal for the second memory component from the second signal value to the first signal value;
   initiating, within the first time period of the controller clock signal, a first cycle of a first memory component clock signal for the first memory component based on the first test-enable signal;
   triggering, by the first cycle of the first memory component clock signal, the first memory component to read a first memory value stored at the first memory address in the first memory component;
   transitioning, at the end of the first time period of the controller clock signal, the first test-enable signal from the first signal value to the second signal value and transitioning the second test-enable signal from the second signal value to the first signal value;
   initiating, within a second time period of the controller clock signal, a first clock cycle of a second memory component clock signal for the second memory component based on the second test-enable signal transitioning from the second signal value to the first signal value;
   triggering, by the first clock cycle of the second memory component clock signal, the second memory component to read a second memory value stored at the first memory address of the second memory component;
   sending the first and second memory values from the first and second memory components, respectively, to a multiplexer; and
   transferring the first and second memory values serially to combining circuitry.

9. The method of claim 8, further comprising:
   combining, by the combining circuitry, the first and second memory values to generate a combined signal; and
   transferring the combined signal to a signature register.

10. The method of claim 9, further comprising:
    calculating, by the signature register, a test signature based on the combined signal; and
    comparing, by the signature register, the test signature to an expected signature.

11. The method of claim 8, further comprising:
    generating a delayed first test-enable signal and a delayed second test-enable signal; and sending the delayed first and second test-enable signals to the multiplexer;

wherein the first and second memory values are serially transferred to the combining circuitry based on the delayed first and second test-enable signals.

12. The method of claim 8, further comprising:

reading a third memory value stored at a second memory address of the first memory component based on the controller clock signal, the first and second test-enable signals, and the first memory component clock signal; and reading a fourth memory value stored at the second memory address of the second memory component based the controller clock signal, the first and second test-enable signals, and the second memory component clock signal.

13. A device, comprising:

a built-in self-test (BIST) controller coupled to read-only memories (ROMs);

a memory data path circuit coupled to the BIST controller and to the ROMs;

a control clock coupled to the memory data path circuit; and a BIST data analysis component coupled to the BIST controller, the memory data path circuit and the control clock, wherein the BIST data analysis component is configured to test memory values read from the ROMs.

14. The device of claim 13, wherein the BIST data analysis component includes:

a multiple input signature register (MISR) coupled to the BIST controller, the memory data path circuit and the control clock; and a comparator having a first input coupled to an output of the MISR, a second input coupled to an output of the BIST controller, an output configured to output a test result signal, the comparator further including outputs coupled to inputs of the BIST controller.

15. The device of claim 14, further comprising a fault indicator coupled to receive the test result signal from the comparator, the fault indicator also coupled to the control clock to receive signals therefrom.

16. The device of claim 15, wherein the control clock includes a buffer and a phase locked loop (PLL), each coupled to receive an input clock signal, the buffer configured to delay the input clock signal to generate a delayed clock signal and provide the delayed clock signal to the fault indicator.

17. The device of claim 14, wherein:

the control clock is configured to output a clock signal to the BIST controller, the memory data path circuit, a clock gate of each of the ROMs, and the MISR;

the BIST controller is configured to send a memory address signal to the memory data path circuit according to the clock signal; and the memory data path circuit is configured to send, according to a clock signal, test signals to the ROMs indicating memory addresses of the memory address signal, and to send test-enable signals to the ROMs, respectively.

18. The device of claim 17, wherein the test-enable signals enable the ROMs to read values stored therein during different clock cycles of the clock signal.

19. The device of claim 18, wherein:

the ROMs are configured to send the values read to the memory data path circuit in respective ROM signals; and the memory data path circuit is configured to combine the ROM signals to generate a combined ROM signal and forward the combined ROM signal to the MISR.

* * * * *